United States Patent [19]

Enkaku et al.

[11] Patent Number: 4,924,290

[45] Date of Patent: May 8, 1990

[54] SEMICONDUCTOR DEVICE HAVING IMPROVED MULTILAYERED WIRINGS

[75] Inventors: Motohiro Enkaku, Sagamihara; Toshiya Kato, Kawasaki, both of Japan

[73] Assignee: Kabushiki Kaisha Toshiba, Kawasaki, Japan

[21] Appl. No.: 238,122

[22] Filed: Aug. 30, 1988

[30] Foreign Application Priority Data

Aug. 31, 1987 [JP] Japan ............................ 62-216710

[51] Int. Cl.$^5$ .................... H01L 23/48; H01L 29/46; H01L 27/10
[52] U.S. Cl. ..................................... 357/68; 357/71; 357/45
[58] Field of Search ....................... 357/45, 71, 68

[56] References Cited

U.S. PATENT DOCUMENTS

| | | | |
|---|---|---|---|
| 4,453,176 | 6/1984 | Chance et al. | 357/70 |
| 4,568,961 | 2/1986 | Noto | 357/40 |
| 4,656,370 | 4/1987 | Kanuma | 357/68 |
| 4,694,320 | 9/1987 | Asano | 357/68 |
| 4,716,452 | 12/1987 | Kondoh et al. | 357/45 |
| 4,811,073 | 3/1989 | Kitamura et al. | 357/71 |

FOREIGN PATENT DOCUMENTS

| | | | |
|---|---|---|---|
| 135747 | 8/1984 | Japan | 357/45 M |
| 100955 | 5/1986 | Japan | 357/68 |
| 2137413 | 10/1984 | United Kingdom . | |

OTHER PUBLICATIONS

Review of The Electrical Communication Laboratories, vol. 26, No. 9/10, Sep./Oct. 1978, pp. 1355–1366; K. Wada et al: "Master–Slice Layout Design for Emitter Coupled Logic LSI".

Proceedings of the First International IEEE VLSI Multilevel Interconnection Conference, New Orleans, LA, 21–22 Jun. 1984, pp. 290–297, IEEE; A. Feller et al: "A 1.24 micron CMOS–SOS DLM Optimized Standard Cell Technology".

Primary Examiner—Rolf Hille
Assistant Examiner—Robert P. Limanek
Attorney, Agent, or Firm—Oblon, Spivak, McClelland, Maier & Neustadt

[57] ABSTRACT

A semiconductor device includes a circuit block formed on a semiconductor chip with multilayered wiring layers having two or more layers, and having a specific function assigned thereto, a first current path pattern formed in a first layer of the multilayered wiring layers and running around the circuit block, a second current path pattern formed in a second layer of the multilayered wiring layers and running around the circuit block, part of the second current path pattern lying over the first current path pattern and the other portion of the second current path pattern lying off the first current path pattern so as to define a connection space with a predetermined width between the first current path pattern and the second current path pattern, a first signal path pattern formed in the first layer of the multilayered wiring layers and serving as a signal path to the circuit block, a second signal path pattern formed in the second layer of the multilayered wiring layers and serving as the signal path to the circuit block, and a via contact, formed in the connection space, for electrically coupling the first signal path pattern and the second signal path pattern.

21 Claims, 5 Drawing Sheets

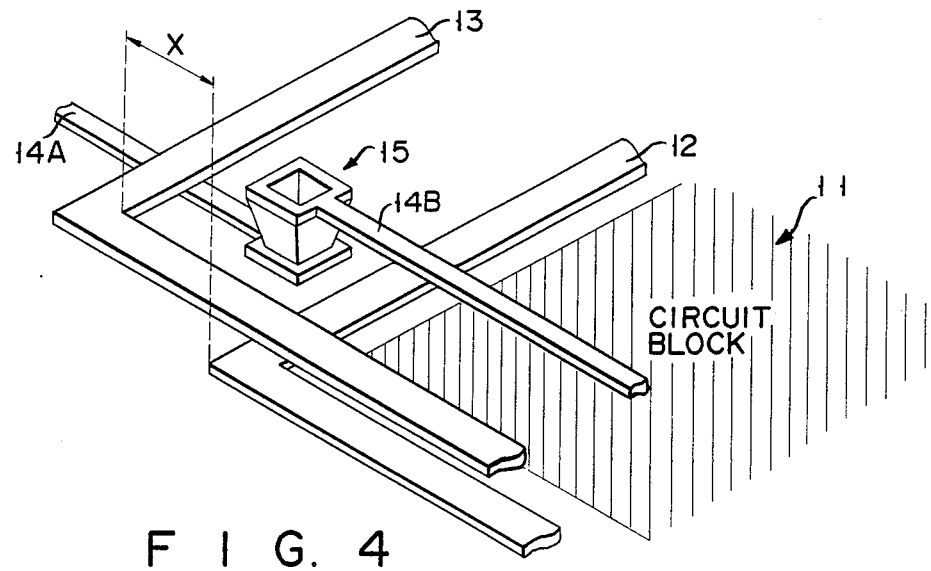
F I G. 4
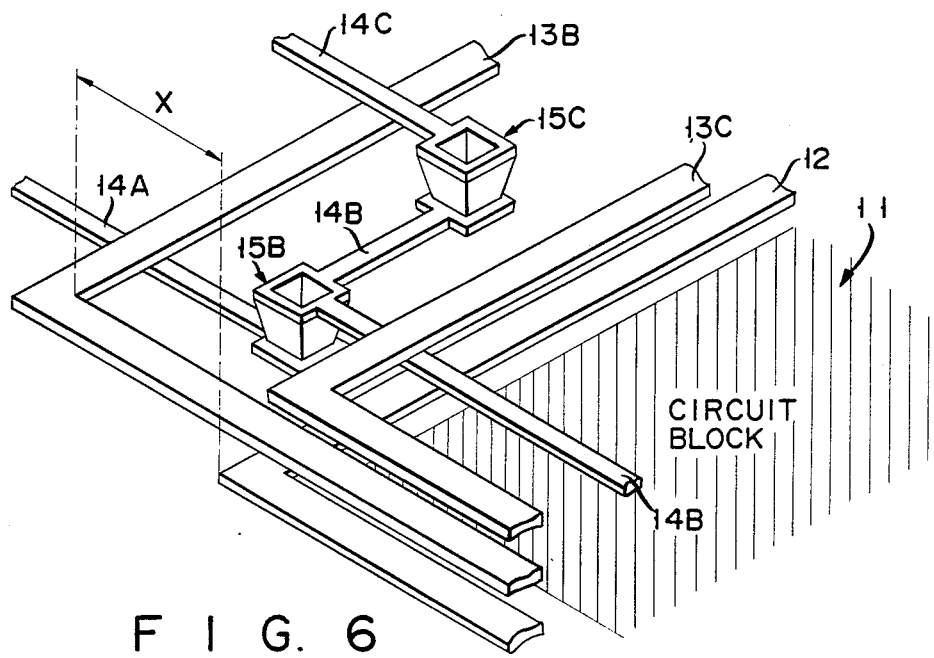
F I G. 6

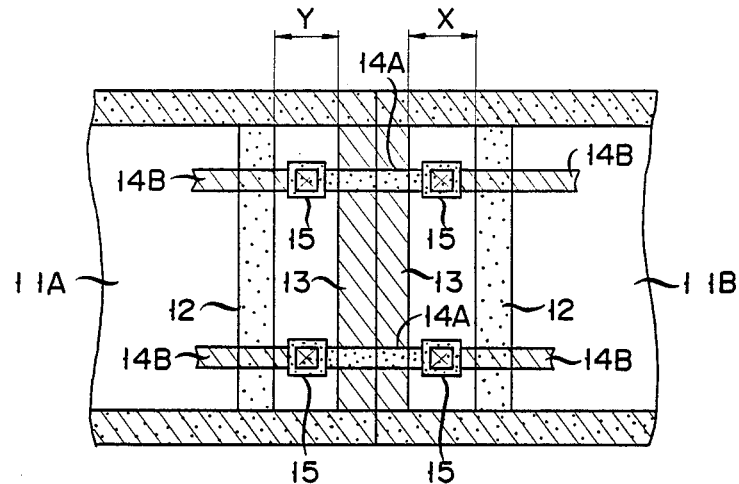
F I G. 7
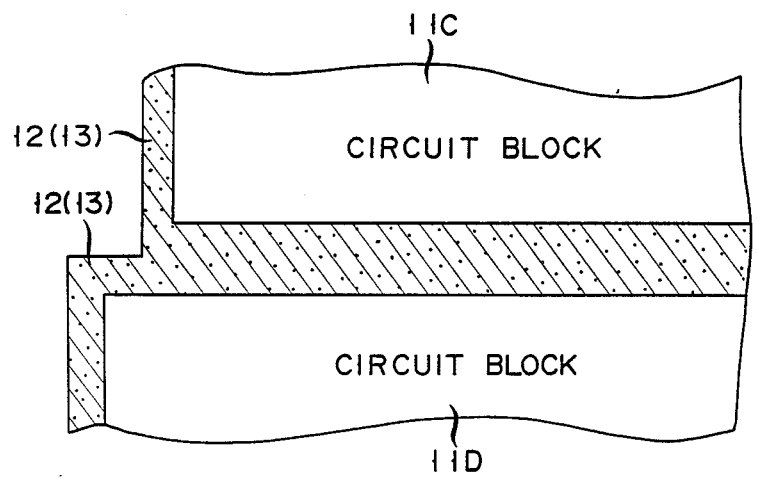
F I G. 8

SEMICONDUCTOR DEVICE HAVING IMPROVED MULTILAYERED WIRINGS

Background of the Invention

1. Field of the Invention

The present invention relates to improved multilayered wirings of a semicustomized semiconductor integrated circuit (semicustomized IC) of a standard cell type or gate array cell type, and, more particularly, to a semiconductor IC which improves the current capacity of power wirings provided around each circuit block of specific function within the IC to supply a source voltage to that block.

2. Description of the Related Art

With a help of CAD (Computer Aided Design), standard cell type or gate array type semicustomized ICs are designed by arranging basic cell blocks prepared in advance and/or medium/large scaled circuit blocks of specific function which are each a collection of such basic cell blocks and mutually wiring these blocks. In this case, power wirings for power supply to the basic cell blocks or each circuit block of specific function are provided at the same time. Recently, however, particular attention is being paid to the connection of the power wirings to the circuit blocks of specific function or the shape of the wirings in terms of a current capacity.

FIG. 1 is a plan pattern diagram exemplifying the arrangement of one of circuit blocks of specific function in a semicustomized IC. In the diagram, numeral 31 is a circuit block of specific function having a plurality of basic cell blocks. Two power wirings 32 and 33 for supplying two types source voltages, for example, a high potential VDD and a ground potential VSS, to circuit block 31 run around this block. These power wirings 32 (VDD) and 33 (VSS) are formed by the first and second aluminum layers, respectively. In addition to power wirings 32 and 33, a signal wiring 34 needs to be provided for signal transfer between different circuit blocks of specific function. If this signal wiring 34 is formed by the second aluminum layer 33, however, the material of that portion of power wiring 33, formed by the second aluminum layer, which crosses signal wiring 34 needs to be changed to the first aluminum layer 32. Therefore, the changed first and second aluminum layer portions of power wiring 33 are coupled together by a via contact section 35.

In constituting power wirings with a help of CAD, in order to supply a source voltage to a large scale circuit block of specific function with a sufficient current capacity, it is significantly effective that these power wirings run over entirely around that circuit block.

Aluminum, Al, has been used, and will be still widely used for some time, as a material for wirings that couple transistors, capacitors, resistors, etc. to constitute an electronic circuit. This is because aluminum has many advantages as a wiring material; for example, it has a lower electric resistance next to rare metal, such as silver, and good adhesiveness to a silicon oxide film, and is easy to be made into a thin film, chemically stable and easy to be processed.

A flow of electricity in wirings causes electro migration, which is a gradual movement of atoms in the direction of the stream of electrons due to momentum transition caused by collision of the electrons with the atoms. As the current density increases, this electro migration becomes prominent, and, if some sort of distortion, such as a crystal boundary, occurs in the flow of atoms in a wiring, the atoms are locally dried out to thereby cause disconnection of the wire or they are locally accumulated to thereby form a hillock. Since the durability of a wiring influenced by the electro migration is inversely proportional to the square to the cube of the current density, the durability of the wiring may be reduced by reduction in cross-sectional area of the wiring due to an ever-decreasing minuscule size of a semiconductor device and an increase in current density due to the reduction in cross-sectional area of the wiring.

The following measures can be taken to prevent reduction in durability of aluminum wirings due to electro migration:

(1) To effectively reduce the distortion in the migration of atoms, the diameter of a crystal boundary is made significantly small by selecting the conditions of aluminum vapor deposition.

(2) Or this diameter is made significantly large so that the crystal boundary does not have cross points within a wiring and the crystal boundary simply crosses the wiring (bamboo structure).

(3) To effectively suppress the migration of atoms, a different element is added to aluminum to form an alloy, such as Al-Si-Cu.

(4) As a recent method, a layered structure of Al and a transition element, such as Ti, or its silicide is used.

Even with utilization of these measures, the allowable current density is limited to about 1 to $2 \times 10^5$ A/cm$^2$ because of the reliability of an Al-based wiring, and a greater current density due to a minuscule size of a semiconductor device would require a new material, such as tungsten, which has a small electro migration.

Although the cross-sectional area of a wiring becomes smaller due to a further reduction in device's size, the size of a device chip is the same or, more likely, tends to become larger and wirings become longer, thereby increasing their resistance accordingly. In addition, higher integration further complicates the wiring layout.

All of the above problems may be overcome by the use of a multilayered wiring structure; for example, a three-layered structure in which the first layer contains wirings in a circuit block, the second one contains wirings between different circuit blocks and the third one contains power wirings for supplying power to the individual circuit blocks.

There are two things to consider in realizing a multilayered structure; interlayer insulation and interlayer connection (via contact). With regard to the interlayer insulation, a silicon oxide film of about 1 μm thickness serves well to provide electric insulation; however, if the insulation film is deposited simply on the first layer wirings, its surface reflects the outlines of the wirings and shows heavy upheavals, which may well cause disconnection at the stepped portions at the time the second layer wirings are formed.

FIG. 2A is an enlarged plan view of the aforementioned via contact section 35 that is used to mutually couple the multilayered wirings. FIG. 2B is a cross section of FIG. 2A as taken along the line A—A*. In view of a process for forming via contact section 35, a thin portion 43 is formed on part of a second aluminum layer 42 coupled to a first aluminum layer 41. And at a constant temperature, the resistance of this thin portion is as large as about 20 to 25 times that of the other portion of layer 42 with a normal thickness. In addition, the thin portion 43 has a higher current density than the other portion, so that the flow of a current through via contact section 35 would cause local increase in temperature at the thin portion. The heat generated there cannot therefore be neglected. This reduces the current capacity of the power wirings and increases a power loss in power supplying path.

In general, power wirings are wider than other wirings so that the use of a via contact section, wider than the power wirings, with the wirings would raise a problem on high integration of a chip.

As explained above, if a power wiring for supplying one type of power is constituted by different conductive layers which are coupled together by a via contact section, its current capacity is reduced and, what is more, the use of the via contact with such a large area stands in the way of a higher chip integration.

SUMMARY OF THE INVENTION

Accordingly, it is an object of this invention to provide a semiconductor integrated circuit which prevents reduction in current capacity of power wirings or the like and is unlikely to deteriorate the chip integration density.

The semiconductor integrated circuit of this invention comprises a circuit block having predetermined function and two or more wirings for a large current which run around the circuit block and have a region where they do not overlap one another. These wirings are each constituted by a single conductive layer for supplying a various source voltages to the circuit block and they do not have a joint section like a via contact section.

As the semiconductor integrated circuit of this invention has each large-current wiring constituted only by a single conductive layer and running around a circuit block of specific function, no via contact section is necessary to supply a large current to the circuit block. In addition, the provision of a region at which a plurality of large-current wirings do not overlap one another permits signal wirings to cross the current wirings at that region.

BRIEF DESCRIPTION OF THE DRAWINGS

FIG. 4 is a perspective view of parts of the structure shown in FIG. 3;

FIG. 6 is a perspective view illustrating an example of a three-layered structure as developed from the double-layered structure shown in FIG. 4;

FIG. 7 is a diagram illustrating a via contact section (15) for signal wiring sections (14A, 14B) in a case where two ICs each having the structure shown in FIG. 3 are provided adjacent to each other;

FIG. 8 is a diagram illustrating the structure for permitting adjacent blocks (11C, 11D) to share power wiring sections (12, 13) in the case where two ICs each having the structure shown in FIG. 3 are provided adjacent to each other.

DETAILED DESCRIPTION OF THE PREFERRED EMBODIMENTS

An embodiment of this invention will be described below with reference to the accompanying drawings.

Figure 3:
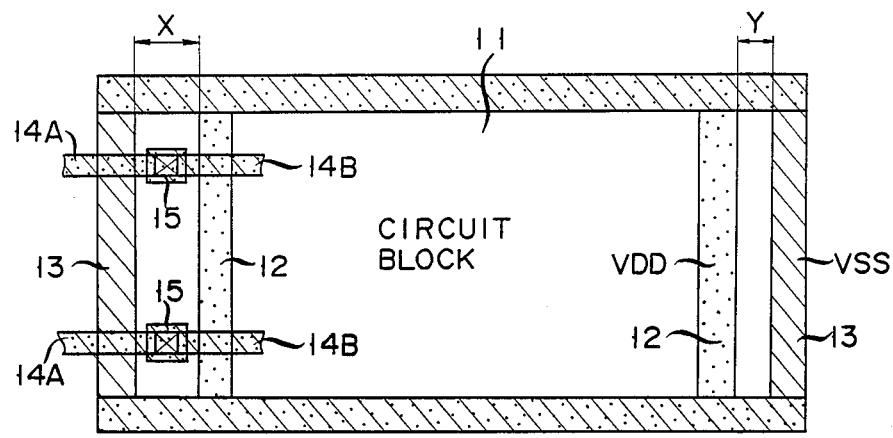
FIG. 3 is a diagram illustrating the IC structure according to one embodiment of this invention.

FIG. 3 is a plan pattern diagram illustrating the structure of a single circuit block of specific function of a semicustomized IC embodying this invention. In the diagram, numeral 11 is a circuit block of specific function which is constituted by a collection of a plurality of basic cell blocks each comprising a two-input NAND gate, a two-input NOR gate, an inversion gate, etc. This block 11 may be constituted by a RAM, a ROM, an ALU, a multiplier, or the like.

Two power wirings 12 and 13 for supplying two types of source voltages, e.g., a high potential VDD and a ground potential VSS, to circuit block 11 are provided around the block 11. Power wiring 12 for voltage VDD is constituted only by a first aluminum layer, and the other power wiring 13 (for voltage VSS) only by a second aluminum layer. The first and second aluminum layers are separated from each other by a $SiO_2$ insulation layer (not shown). The two power wirings 12 and 13 overlap each other except at some parts thereof, i.e., those regions with widths X and Y on the right and left sides of circuit block 11. This overlapping structure can form a by-pass capacitor between wirings 12 and 13. In addition, with the direction of a current flowing through wiring 12 being reversed to that of a current flowing through wiring 13, the inductance components of wirings 12 and 13 can be cancelled out each other.

For example, on the left region (X) of circuit block 11, as shown in FIG. 4, a signal wiring 14A constituted by the first aluminum layer is provided so as to cross power wiring 13 that is constituted by the second aluminum layer, and another signal wiring 14B constituted by the second aluminum layer is provided running across power wiring 12 that is constituted by the first aluminum layer. These signal wirings 14A and 14B serve to transfer signals between different circuit blocks of specific function, and are coupled through a via contact section 15 as shown in cross section in FIG. 5. (The shaded section in the diagram is a $SiO_2$ insulation layer.) The locations, shapes, etc. of these wirings 12, 13, 14A and 14B can all be automatically determined by a CAD software that runs on a minicomputer or a work station.

FIG. 4 illustrates double-layered wirings, and FIG. 6 three-layered wirings.

Figure 2A:
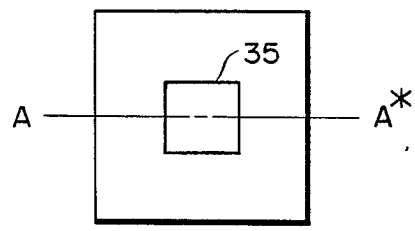
FIG. 2A is an enlarged view of a via contact section (35) in FIG. 1.
Figure 2B:
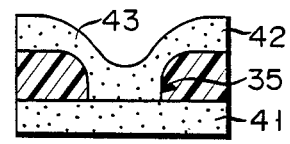
FIG. 2B is a cross section of FIG. 2A along the line A—A*.

With the above structure, since two power wirings 12 and 13 that need a large current capacity are each constituted only by a single aluminum layer, they need not be coupled through a via contact section as shown in FIG. 2B. This overcomes all the problems (abnormal increase in electric resistance and local heat generation) originated from providing such a via contact section to power wirings, and permits power wirings 12 and 13 to run around the circuit block and a sufficient source current to be supplied to each basic cell block in the circuit block with a high efficiency.

Figure 1:
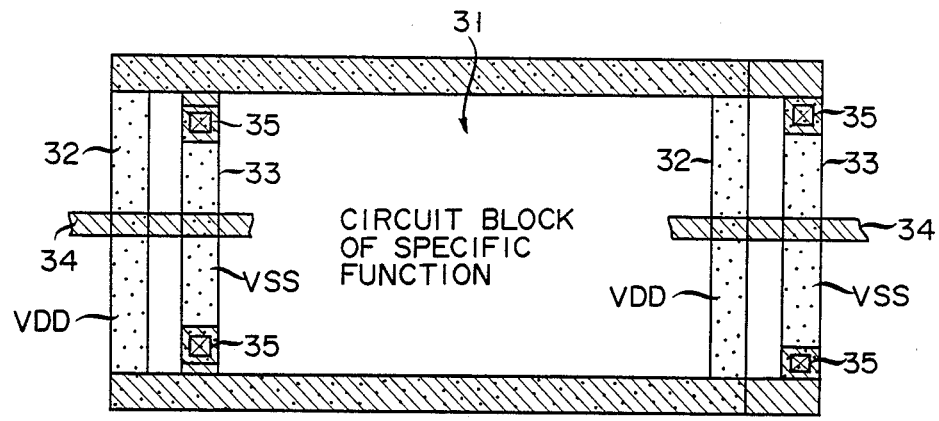
FIG. 1 is a diagram illustrating the structure of an IC for explaining the problems raised without the use of this invention.

Signal wirings 14A and 14B, as shown in FIG. 4, need to be coupled together through via contact section 15. Generally, these signal wirings 14A and 14B deal only with a minute current and can be made sufficiently narrower than power wirings 12 and 13, so that via contact section 15 can be made smaller accordingly. Therefore, the structure shown in FIG. 3 can improve the overall integration density of an IC chip, as compared with the structure shown in FIG. 1.

FIG. 7 is a plan pattern diagram illustrating the structure of an applied example of this invention. With the exemplified IC in which two circuit blocks 11A and 11B are provided adjacent to each other, signal transfer may be needed between the blocks. In such a case, on the side of circuit block 11A, signal wiring 14B constituted by the second aluminum layer is provided running across power wiring 12 constituted by the first aluminum layer, and signal wiring 14A constituted by the first aluminum layer is provided running across power wiring 13 constituted by the second aluminum layer. On the side of the other circuit block 11B, the above signal wiring 14A extends to run across power wiring 13 constituted by the second aluminum layer and signal wiring 14B constituted by the second aluminum layer is provided running across power wiring 12 that is constituted by the first aluminum layer. Signal wirings 14B and 14A are coupled together through via contact section 15 in region Y in circuit block 11A, and signal wirings 14A and 14B are coupled through another via contact section 15 in region X in the other circuit block 11B. If the positions where signal wirings 14A and 14B are provided are set in advance in such a way as to be aligned between both circuit blocks, power wirings 12 and 13 and signal wirings 14A and 14B can be easily constituted.

FIG. 8 is a plan pattern diagram illustrating the structure of another applied example of this invention. In this exemplified IC, part of power wiring 12 and part of power wiring 13 are commonly provided between two adjacent circuit blocks 11C and 11D so as to make power wirings 12 and 13 at this region twice as wide as the remaining portions of these wirings. This structure permits a larger source current to be supplied to the circuit blocks with a high efficiency or with less power loss.

Figure 5:
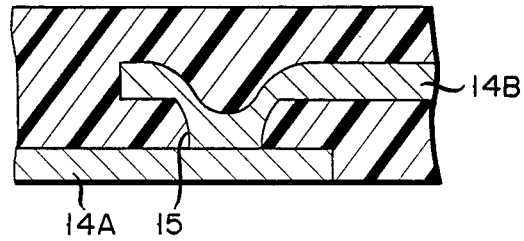
FIG. 5 is a cross section of a via contact section (15) in FIG. 3.
Figure 9:
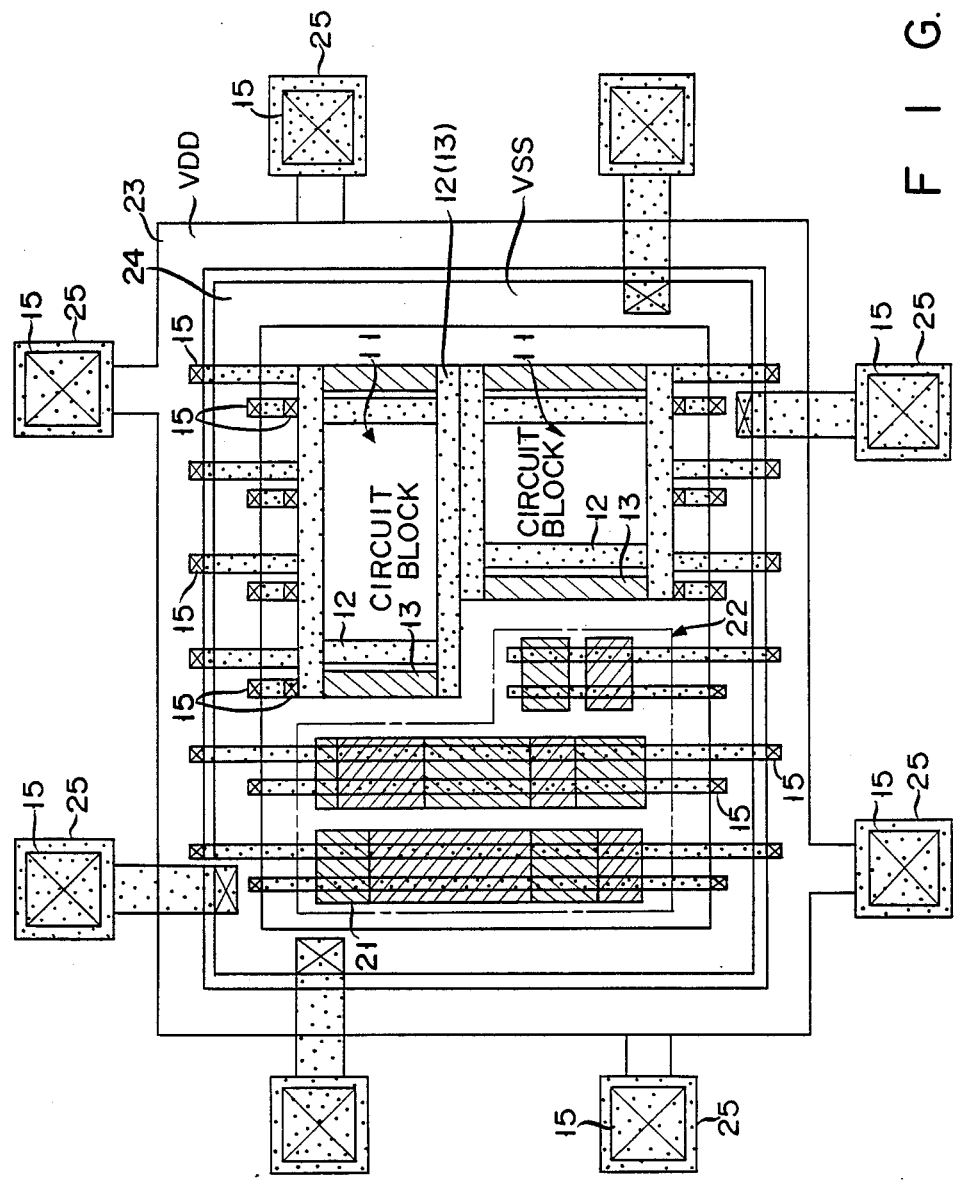
FIG. 9 is a diagram exemplifying the internal structure of a semicustomized IC including the structure according to this invention.

FIG. 9 is a plan pattern diagram illustrating the structure of the overall chip of a practical semicustomized IC embodying this invention. This IC chip includes, for example, two circuit blocks of specific function 11 and a basic cell region 22 consisting of a plurality of basic cell blocks 21. A VDD wiring 23 and a VSS wiring 24, both constituted by the second aluminum layer, run around the chip, and are coupled to a plurality of power source pads 25 constituted by the second aluminum layer through wirings that are constituted by either the first or second aluminum layer. Power wirings 12 and 13 each with a double-layered structure, which run around the two circuit blocks 11, are coupled to VDD wiring 23 and/or VSS wiring 24 through a wiring constituted by the first aluminum layer. Numeral 15 in FIG. 9, like the one in FIG. 5, is a via contact section for coupling the first and second aluminum layers.

The reason why the wiring constituted only by the first aluminum layer is used to couple power wirings 12 and 13 to VDD wiring 23 and/or VSS wiring 24, is that wirings (14A and 14B in FIG. 3) constituted by the second aluminum layer generally run in the lateral direction in FIG. 9. Signal wirings 14A and 14B and pads 25 for these wirings are omitted in FIG. 9 for diagrammatic simplicity.

Needless to say, this invention is in no way limited to the above embodiments, but it is modified in various manners within the scope of the invention. For instance, although the embodiment of FIG. 9 has been described with reference to power wirings running around a circuit block of specific function and being constituted by aluminum layers with a double-layered structure, the power wirings may be constituted by three-, or more, layered aluminum layers in the case where three or more types of source voltages are required as shown in FIG. 6. Wirings 12 and 13 (13B and 13C) shown in FIG. 4 and 6 may serve as large-current paths other than paths for supplying various powers; for example, circuits for charging/discharging a number of capacitors.

As explained above, this invention can provide a semiconductor integrated circuit which can prevent reduction in current capacity of power wirings or the like due to the use of via contacts and does not deteriorate the chip integration density.

What is claimed is:

1. A semiconductor device comprising:
   at least one circuit block formed on a semiconductor chip with multilayered wiring layers having two or more layers, and having a specific function assigned thereto;
   a first current path pattern formed in a first layer of said multilayered wiring layers and running around said circuit block;
   a second current path pattern formed in a second layer of said multilayered wiring layers and running around said circuit block, part of said second current path pattern lying over said first current path pattern and the other portion of said second current path pattern lying off said first current path pattern so as to define a connection space with a predetermined width between said first current path pattern and said second current path pattern;
   a first signal path pattern formed in said first layer of said multilayered wiring layers and serving as a signal path to said circuit block;
   a second signal path pattern formed in said second layer of said multilayered wiring layers and serving as said signal path to said circuit block; and
   connecting means, formed in said connection space, for electrically coupling said first signal path pattern and said second signal path pattern;
   wherein said first signal path pattern extends under said second current path pattern to outward of said circuit block and said second path pattern extends over said first current path pattern to inward of said circuit block.

2. A semiconductor device comprising:
   at least one circuit block formed on a semiconductor chip with multilayered wiring layers having two or more layers, and having a specific function assigned thereto;
   a first current path pattern formed in a first layer of said multilayered wiring layers and running around said circuit block;
   a second current path pattern formed in a second layer of said multilayered wiring layers and running around said circuit block, part of said second current path pattern lying over said first current path pattern and the other portion of said second current path pattern lying off said first current path pattern so as to define a connection space with a predetermined width between said first current path pattern and said second current path pattern;

a first signal path pattern formed in said first layer of said multilayered wiring layers and serving as a signal path to said circuit block;

a second signal path pattern formed in said second layer of said multilayered wiring layers and serving as said signal path to said circuit block; and connecting means, formed in said connection space, for electrically coupling said first signal path pattern and said second signal path pattern;

wherein said first signal path pattern extends over said first current path pattern to outward of said circuit block and said second signal path pattern extends under said second current path pattern to inward of said circuit block.

3. A semiconductor integrated circuit comprising:
a circuit block having a predetermined function;
multilayered current wirings, including a first current path pattern and a second current path pattern which surround said circuit block and overlap each other except for a predetermined portion for supplying currents to said circuit block; and
signal wirings, including a first signal path pattern and a second signal path pattern part of which is electrically connected to part of said first signal path pattern at said predetermined portion, wherein said first signal path pattern extends under said second current path pattern to outward of said circuit block and said second signal path pattern extends over said first current path pattern to inward of said circuit block.

4. A semiconductor integrated circuit comprising:
a circuit block having a predetermined function;
multilayered current wirings, including a first current path pattern and a second current path pattern which surround said circuit block and overlap each other except for a predetermined portion, for supplying currents to said circuit block; and
signal wirings, including a first signal path pattern and a second signal path pattern part of which is electrically connected to part of said first signal path pattern at said predetermined portion, wherein said first signal path pattern extends over said first current path pattern to outward of said circuit block and said second signal path pattern extends under said second current path pattern to inward of said circuit block.

5. A semiconductor integrated circuit comprising:
a circuit block having a predetermined function; and
multilayered current wirings, surrounding said circuit block and being arranged not to overlap each other at portions thereof, for supplying different currents to said circuit block, each of said multilayered current wirings being constituted by a single conductive layer;
wherein conductive layers constituting said current wirings are shared by different circuit blocks adjacent to each other.

6. A semiconductor device comprising:
at least one circuit block formed on a semiconductor chip with multilayered wiring layers having two or more layers, and having a specific function assigned thereto;
a first current path pattern formed in a first layer of said multilayered wiring layers and running around said circuit block;
a second current path pattern formed in a second layer of said multilayered wiring layers and running around said circuit block, wherein most of said second current path pattern lies over said first current path pattern and a portion of said second current path pattern lies off said first current path pattern so as to define a connection space with a predetermined width between said first current path pattern and said second current path pattern;

a first signal path pattern formed in said first layer of said multilayered wiring layers and serving as a signal path to said circuit block;

a second signal path pattern formed in said second layer of said multilayered wiring layers and serving as said signal path to said circuit block; and connecting means, formed in said connection space, for electrically coupling said first signal path pattern and said second signal path pattern;

wherein said first current path pattern and said second current path pattern serve as power feeding paths to said circuit block;

wherein high frequency components in said source currents on said power feeding paths are by-passed by capacitance components formed between said first current path pattern and said second current path pattern at those portions thereof at which said first and second current path patterns overlap each other.

7. The semiconductor device according to claim 6, wherein a direction of a source current flowing through said first current path pattern is opposite to that of a source current flowing through said second current path pattern, whereby said source current of said first current path pattern cancels a magnetic field generated by said source current of said second current path pattern, thereby reducing inductance components of said power feeding paths.

8. The semiconductor device according to claim 6, wherein said first signal path pattern extends under said second current path pattern to outward of said circuit block and said second signal path pattern extends over said first current path pattern to inward of said circuit block.

9. The semiconductor device according to claims 1 or 2, wherein said first current path pattern and said second current path pattern serve as power feeding paths to said circuit block.

10. The semiconductor device according to claim 9, wherein a direction of a source current flowing through said first current path pattern is opposite to that of a source current flowing through said second current path pattern, whereby said source current of said first current path pattern cancels a magnetic field generated by said source current of said second current path pattern, thereby reducing inductance components of said power feeding paths.

11. The semiconductor device according to claim 9, wherein high frequency components in said source currents on said power feeding paths are by-passed by capacitance components formed between said first current path pattern and said second current path pattern at those portions thereof at which said first and second current path patterns overlap each other.

12. The semiconductor device according to claims 1, 2 or 6, wherein said connecting means includes a via contact for electrically coupling said first signal path pattern to said second signal path pattern.

13. The semiconductor device according to claims 1, 2 or 6, wherein said first and second current path patterns contain a high conductive metal.

14. The semiconductor device according to claims 1, 2 or 6, wherein two or more circuit blocks assigned with respective predetermined functions are formed on said semiconductor chip and said first current path pattern surrounding one of said circuit blocks is at least partially coupled in parallel to said first current path pattern surrounding an other one of said circuit blocks, thereby reducing an electric resistance of said first current path pattern.

15. The semiconductor device according to claims 1, 2 or 6, wherein two or more circuit blocks assigned with respective predetermined functions are formed on said semiconductor chip and said second current path pattern surrounding one of said circuit blocks is at least partially coupled in parallel to said second current path pattern surrounding an other one of said circuit blocks, thereby reducing an electric resistance of said second current path pattern.

16. A semiconductor device comprising:
a circuit block formed on a semiconductor chip with multilayered wiring layers having three or more layers, and having a specific function assigned thereto;
a first current path pattern formed in a first layer of said multilayered wiring layers and running around said circuit block;
a second current path pattern formed in a second layer of said multilayered wiring layers and running around said circuit block, part of said second current path pattern lying over said first current path pattern and the other portion of said second current path pattern lying off said first current path pattern so as to define a connection space with a predetermined width between said first current path pattern and said second current path pattern;
a third current path pattern formed in that portion of a third layer of said multilayered wiring layers which excludes said connection space and running around said circuit block, part of said third current path pattern lying over said second current path pattern;
a first signal path pattern formed in said first layer of said multilayered wiring layers and serving as a signal path to said circuit block;
a second signal path pattern formed in said second layer of said multilayered wiring layers and serving as said signal path to said circuit block;
a third signal path pattern formed in said third layer of said multilayered wiring layers;
first connecting means, formed in said connection space, for electrically coupling said first signal path pattern and said second signal path pattern; and
second connecting means, formed in said connection space, for electrically coupling said second signal path pattern and said third signal path pattern.

17. The semiconductor integrated circuit according to claims 5 or 6, wherein signal wirings formed in said portions where said current wirings do not overlap each other, and arranged to cross said current wirings, and said signal wiring is constituted by a conductive layer different from said conductive layer of said current wiring across which said signal wiring runs.

18. The semiconductor integrated circuit according to claims 3, 4, 5 or 6, wherein said current wirings are constituted by two or more conductive layers.

19. The semiconductor integrated circuit according to claims 3, 4, 5 or 6, wherein all of said conductive layers are formed of a metal having a high conductivity.

20. The semiconductor integrated circuit according to claim 17, wherein conductive layers constituting said two or more signal wirings and lying in different layers are mutually coupled through a via contact section.

21. The semiconductor integrated circuit according to claims 3 or 4, wherein conductive layers constituting said current wirings are shared by different circuit blocks adjacent to each other.

* * * * *